(12) United States Patent
Muis

(10) Patent No.: US 8,354,186 B2
(45) Date of Patent: Jan. 15, 2013

(54) INTERCONNECTION WASHER ASSEMBLY FOR A BATTERY ASSEMBLY

(75) Inventor: Pascal Muis, Pontoise (FR)

(73) Assignee: Johnson Controls—SAFT Advanced Power Solutions LLC, Wilmington, DE (US)

( * ) Notice: Subject to any disclaimer, the term of this patent is extended or adjusted under 35 U.S.C. 154(b) by 0 days.

(21) Appl. No.: 13/042,374

(22) Filed: Mar. 7, 2011

(65) Prior Publication Data

US 2011/0206978 A1 Aug. 25, 2011

Related U.S. Application Data

(63) Continuation of application No. PCT/US2009/056247, filed on Sep. 8, 2009.

(60) Provisional application No. 61/095,597, filed on Sep. 9, 2008, provisional application No. 61/095,569, filed on Sep. 9, 2008.

(51) Int. Cl.
*H01M 2/22* (2006.01)
*H01R 3/00* (2006.01)

(52) U.S. Cl. .................. 429/158; 439/500; 439/627

(58) Field of Classification Search .................. None
See application file for complete search history.

(56) References Cited

U.S. PATENT DOCUMENTS

| 7,082,389 B2 | 7/2006 | Nahas |
| 2002/0022178 A1 | 2/2002 | Asaka et al. |
| 2006/0094289 A1* | 5/2006 | Kim et al. ............ 439/500 |

FOREIGN PATENT DOCUMENTS

| DE | 203 20 473 | 10/2004 |
| DE | 1020060 02 457 | 8/2007 |
| JP | 2002-246074 A | 8/2002 |
| KR | 10-0394682 B1 | 8/2003 |
| KR | 10-0684743 B1 | 2/2007 |
| KR | 10-2008-0020784 A | 3/2008 |

OTHER PUBLICATIONS

Machine translation of JP 2002-246074, Aug. 2002.*
Office action response for European Patent Application No. 08806875.4, dated Jun. 22, 2011, 10 pages.
International Search Report and Written Opinion for International Application No. PCT/US2009/056247, date of completion May 3, 2010, 6 pages.
Office Action for European Application No. 08806875.4, mail date Feb. 17, 2011, 5 pages.

* cited by examiner

*Primary Examiner* — Jonathan Crepeau
(74) *Attorney, Agent, or Firm* — Foley & Lardner LLP

(57) ABSTRACT

A battery module having a washer assembly includes a plurality of electrochemical cells. Each of the cells includes at least one terminal. A circuit board includes a plurality of apertures. Each of the apertures is configured for receiving a terminal of one of the plurality of electrochemical cells. A plurality of flat washers are coupled to the circuit board. An inner diameter of each of the washers is aligned with a central axis of each of the apertures of the circuit board and is configured to receive the associated terminal. The circuit board is configured to allow the plurality of washers to be substantially simultaneously conductively coupled to the terminals of the plurality of electrochemical cells.

11 Claims, 12 Drawing Sheets

INTERCONNECTION WASHER ASSEMBLY FOR A BATTERY ASSEMBLY

CROSS-REFERENCE TO RELATED PATENT APPLICATIONS

This application is a continuation of International Patent Application No. PCT/US2009/056247, filed Sep. 8, 2009, which claims the benefit of and priority to U.S. Provisional Patent Application No. 61/095,597, filed Sep. 9, 2008 and U.S. Provisional Patent Application No. 61/095,569, filed Sep. 9, 2008. The disclosures of International Patent Application No. PCT/US2009/056247, U.S. Provisional Application No. 61/095,522, and U.S. Provisional Patent Application No. 61/095,569 are incorporated herein by reference in their entireties.

BACKGROUND

The present application relates generally to the field of batteries and battery modules. More specifically, the present application relates to batteries and battery modules that may be used in vehicle applications to provide at least a portion of the motive power for the vehicle.

Vehicles using electric power for all or a portion of their motive power (e.g., electric vehicles (EVs), hybrid electric vehicles (HEVs), plug-in hybrid electric vehicles (PHEVs), and the like, collectively referred to as "electric vehicles") may provide a number of advantages as compared to more traditional gas-powered vehicles using internal combustion engines. For example, electric vehicles may produce fewer undesirable emission products and may exhibit greater fuel efficiency as compared to vehicles using internal combustion engines (and, in some cases, such vehicles may eliminate the use of gasoline entirely, as is the case with certain types of PHEVs).

As electric vehicle technology continues to evolve, there is a need to provide improved power sources (e.g., battery modules) for such vehicles. For example, it is desirable to increase the distance that such vehicles may travel without the need to recharge the batteries. It is also desirable to improve the performance of such batteries and to reduce the cost associated with the battery modules.

One area of improvement that continues to develop is in the area of battery chemistry. Early electric vehicle systems employed nickel-metal-hydride (NiMH) batteries as a propulsion source. Over time, different additives and modifications have improved the performance, reliability, and utility of NiMH batteries.

More recently, manufacturers have begun to develop lithium-ion batteries that may be used in electric vehicles. There are several advantages associated with using lithium-ion batteries for vehicle applications. For example, lithium-ion batteries have a higher charge density and specific power than NiMH batteries. Stated another way, lithium-ion batteries may be smaller than NiMH batteries while storing the same amount of charge, which may allow for weight and space savings in the electric vehicle (or, alternatively, this feature may allow manufacturers to provide a greater amount of power for the vehicle without increasing the weight of the vehicle or the space taken up by the battery module).

It is generally known that lithium-ion batteries perform differently than NiMH batteries and may present design and engineering challenges that differ from those presented with NiMH battery technology. For example, lithium-ion batteries may be more susceptible to variations in battery temperature than comparable NiMH batteries, and thus systems may be used to regulate the temperatures of the lithium-ion batteries during vehicle operation. The manufacture of lithium-ion batteries also presents challenges unique to this battery chemistry, and new methods and systems are being developed to address such challenges.

Storage battery assemblies are widely used for power supply of electronic devices and are of main importance for hybrid vehicles. Hybrid vehicles requires high sophisticated cell arrangements in view of cooling the storage battery and control of the cells. Therefore, control units are provided for a set of cells comprising at least one of a temperature sensor, a voltage sensor, and a current sensor for monitoring the status of a set of cells.

A storage battery assembly for vehicles comprises a high number of battery cells which have to be mounted and connected together in a housing by use of conductive bars. This is time consuming and causes high costs of manufacturing. Moreover, the electronic circuitry provided for monitoring and/or controlling of single battery cells or a group of battery cells has to be connected to cell terminals or conductive bars.

Again, establishing the connections is time consuming. Further, due to the wide temperature range in a battery housing and due to the high vibrational loads to which the storage battery assembly may be subjected, a very stable design of the connections is required.

DE 10 2005 055 418 B3 discloses, for example, a storage battery assembly comprising a plurality of prismatic battery cells connected to each other by use of terminals extending to a battery cell housing and carrying an U-formed connection plate. An adjacent battery cell is plugged into the U-formed connection plate and is welded with its housing providing the negative pole to the connection plate.

DE 100 11 233 B4 discloses a battery pack comprising temperature sensors located on a row of battery cells for measuring the temperature of the battery cells.

DE 10 2004 043 138 A1 discloses a battery cover comprising integrated contact portions for connecting to the battery terminals and comprising electronic circuitry. The battery cover can be placed on top of a battery comprising a plurality of battery cells and is intended for use with a starter battery.

EP 1 250 720 B1 discloses a battery cell comprising a battery cell housing and electronic circuitry incorporated into the battery cell housing. A battery cell terminal is connected to the electronic circuitry by use of a spring contact member. The electrodes inside the battery cell housing are connected to a contact plate at the bottom side of the circuit board comprising the electronic circuitry.

US 2006/0091891 A1 discloses a battery assembly comprising a plurality of prismatic battery cells and bus bars on the top of the cell assembly for connecting adjacent battery cell terminals. Temperature measurement members are attached to the bus bars. A printed circuit board made of a thin cupper laminate is connected to the bus bar. A circuit is printed at the printed circuit board to which electric current is transmitted from the bus bar via protrusions and an electric current is transmitted from a thermistor via through holes. The printed circuit board is connected to a battery management system, at which a voltage measuring device and a temperature measuring device are mounted.

KR 10 2004 0005066 A discloses a device for connecting battery cells of hybrid electric vehicles comprising a printed circuit board equipped with an electrical circuit for serial or parallel connection of the cells of a battery. The printed circuit board is electrically connected to each of the cells to connect cells in a serial or parallel manner. A voltage measurement connection socket is connected to the electrical circuit of the printed circuit board and a cell voltage measurement unit.

GB 2 375 223 A discloses a battery management system comprising a printed circuit board and a plurality of electrochemical cells. The printed circuit board is plugged onto cell terminals protruding from the battery cell housing and screwed onto the battery terminals by nuts. The printed circuit board carries hardware and software components in a number of sensors for monitoring and controlling the battery pack. Further, the printed circuit board carries tracks for connecting a pair of cell terminals respectively. Thus, a connection of battery cells serial or parallel and a connection of battery terminals to electronic circuitry for monitoring and controlling battery cells is achieved in one step simply by screwing the printed circuit board onto the cell terminals.

DE 10 2006 002 457 A1 discloses an electrical connector between a printed circuit board and a battery terminal. An electric conductive bushing mounted in a hole of the printed circuit board is plugged and welded onto a battery terminal post.

U.S. Pat. No. 7,028,389 B2 discloses a fixing device for a printed circuit board comprising an elastic washer mounted between the printed circuit board and a fixing pillar. Electric current is able to flow from conductive lines on the printed circuit board through the elastic washer and the fixing pillar to a shell.

DE 203 20 473 U1 discloses a shunt provided in a plate like connector element for cell terminals.

It would be desirable to provide an improved battery module and/or system for use in electric vehicles that addresses one or more challenges associated with NiMH and/or lithium-ion battery modules used in such vehicles. It would also be desirable to provide a battery module and/or system that includes any one or more of the advantageous features that will be apparent from a review of the present disclosure.

SUMMARY

According to an exemplary embodiment, a battery module having a washer assembly includes a plurality of electrochemical cells. Each of the cells includes at least one terminal. A circuit board includes a plurality of apertures. Each of the apertures is configured for receiving a terminal of one of the plurality of electrochemical cells. A plurality of flat washers are coupled to the circuit board. An inner diameter of each of the washers is aligned with a central axis of each of the apertures of the circuit board and is configured to receive the associated terminal. The circuit board is configured to allow the plurality of washers to be substantially simultaneously conductively coupled to the terminals of the plurality of electrochemical cells According to an exemplary embodiment, a battery module includes a plurality of electrochemical cells. Each of the electrochemical cells includes at least one terminal projecting from an end thereof. A plurality of bus bars are provided on a member. Each one of the plurality of bus bars includes an aperture at each end thereof. A member comprises a plurality of conductive members. Each of the conductive members includes an aperture aligned with one of the apertures of one of the plurality of bus bars and with one of the terminals of one of the plurality of electrochemical cells. Each of the conductive members is conductively coupled to a terminal of an electrochemical cell to aid in measuring the voltage of the electrochemical cell.

According to an exemplary embodiment, a battery module includes a plurality of electrochemical cells. Each of the electrochemical cells includes at least one terminal extending from an end of the cell. The battery module also includes a bus bar assembly having a plurality of bus bars. Each one of the plurality of bus bars includes an aperture at each end of the bus bar. The battery module further includes a washer assembly including a plurality of generally flat washers. Each of the washers includes an aperture aligned with one of the apertures of one of the plurality of bus bars and with one of the terminals of one of the plurality of electrochemical cells. Each of the washers is conductively coupled to a terminal of an electrochemical cell.

DETAILED DESCRIPTION

According to an exemplary embodiment, a storage battery assembly for vehicles includes a plurality of electrochemical cells (e.g., batteries, cells, etc.). Each cell comprises a closed housing and at least one terminal extending from the cell housing. Electrical conductive bars are mounted on dedicated terminals. The conductive bars electrically connect the cells. At least one circuit board includes electronic circuitry for monitoring and/or controlling the cells.

Figure 1:
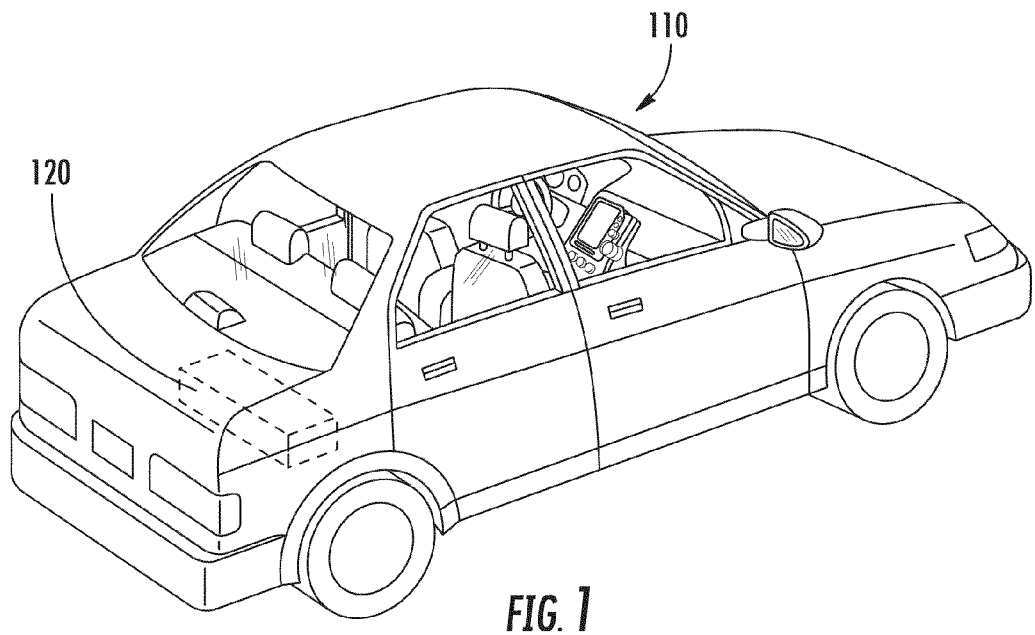
FIG. 1 is a perspective view of a vehicle including a battery module according to an exemplary embodiment.

FIG. 1 is a perspective view of a vehicle 110 in the form of an automobile (e.g., a car) having a battery module 120 for providing all or a portion of the motive power for the vehicle 110. Such a vehicle 110 can be an electric vehicle (EV), a hybrid electric vehicle (HEV), a plug-in hybrid electric vehicle (PHEV), or other type of vehicle using electric power for propulsion (collectively referred to as "electric vehicles").

Although the vehicle 110 is illustrated as a car in FIG. 1, the type of vehicle may differ according to other exemplary embodiments, all of which are intended to fall within the scope of the present disclosure. For example, the vehicle 110 may be a truck, bus, industrial vehicle, motorcycle, recreational vehicle, boat, or any other type of vehicle that may benefit from the use of electric power for all or a portion of its propulsion power.

Although the battery module 120 is illustrated in FIG. 1 as being positioned in the trunk or rear of the vehicle, according to other exemplary embodiments, the location of the battery module 120 may differ. For example, the position of the battery module 120 may be selected based on the available space within a vehicle, the desired weight balance of the vehicle, the location of other components used with the battery module 120 (e.g., battery management systems, vents or cooling devices, etc.), and a variety of other considerations.

Figure 2:
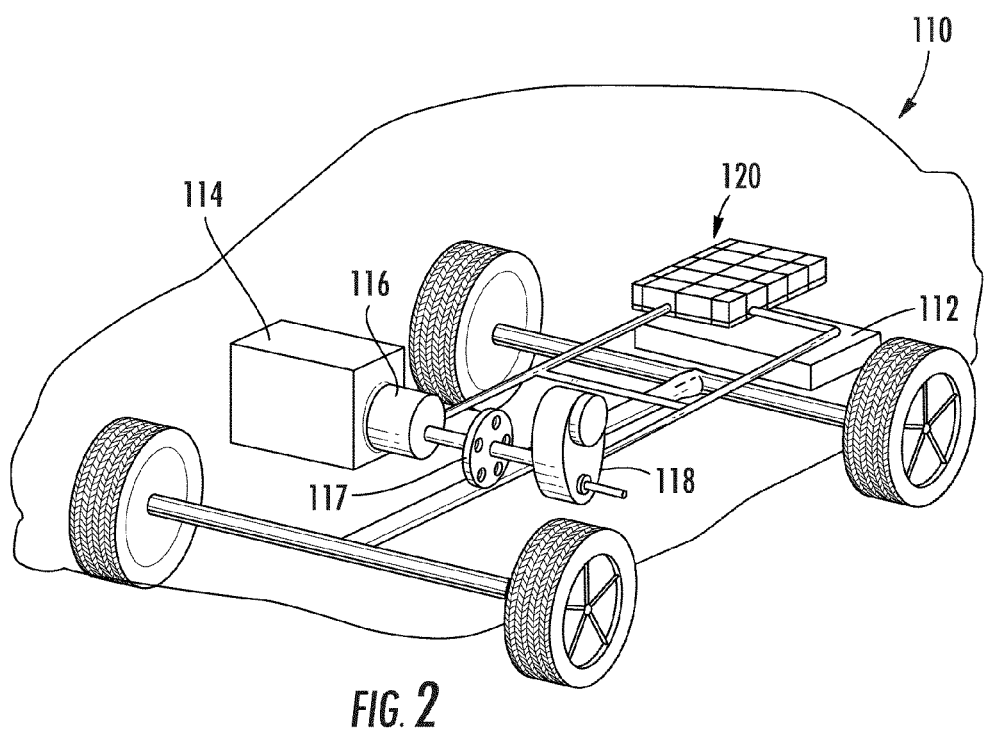
FIG. 2 is a cut-away schematic view of a vehicle including a battery module according to an exemplary embodiment.

FIG. 2 illustrates a cut-away schematic view of a vehicle 110 provided in the form of an HEV according to an exemplary embodiment. A battery module 120 is provided toward the rear of the vehicle 110 proximate a fuel tank 112 (the battery module 120 may be provided immediately adjacent the fuel tank 112 or may be provided in a separate compartment in the rear of the vehicle 110 (e.g., a trunk) or may be provided elsewhere in the vehicle 110). An internal combustion engine 114 is provided for times when the vehicle 110 utilizes gasoline power to propel the vehicle 110. An electric motor 116, a power split device 117, and a generator 118 are also provided as part of the vehicle drive system.

Such a vehicle 110 may be powered or driven by just the battery module 120, by just the engine 114, or by both the battery module 120 and the engine 114. It should be noted that other types of vehicles and configurations for the vehicle drive system may be used according to other exemplary embodiments, and that the schematic illustration of FIG. 2 should not be considered to limit the scope of the subject matter described in the present application.

According to various exemplary embodiments, the size, shape, and location of the battery module 120, the type of vehicle 110, the type of vehicle technology (e.g., EV, HEV, PHEV, etc.), and the battery chemistry, among other features, may differ from those shown or described.

Figure 3:
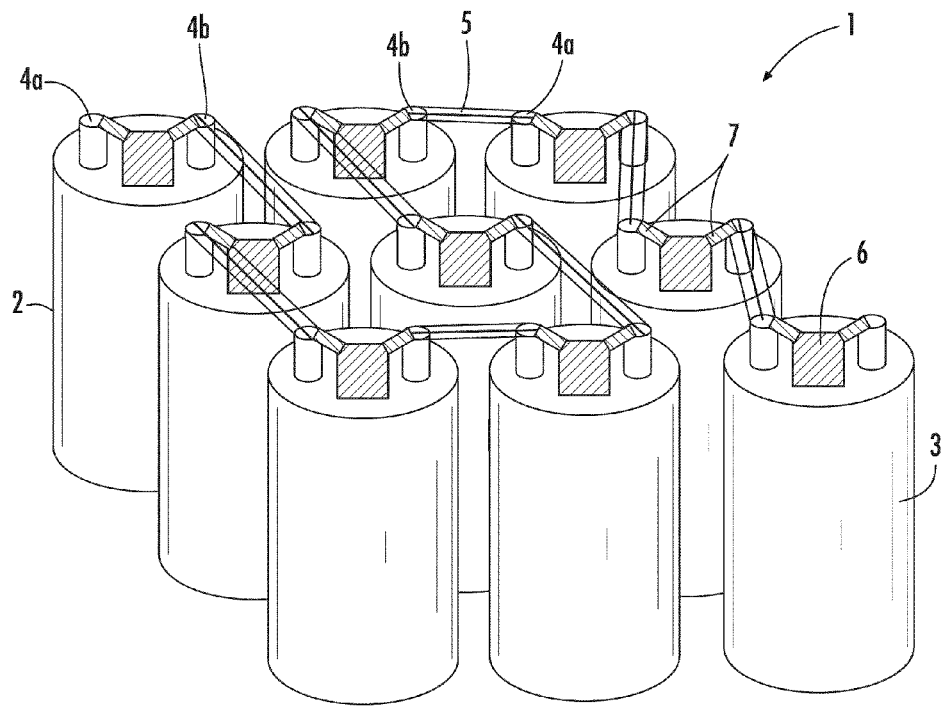
FIG. 3 is a perspective view of a storage battery assembly for vehicles according to an exemplary embodiment.

Referring to FIG. 3, a battery module or assembly 1 is shown according to an exemplary embodiment. According to an exemplary embodiment, the battery assembly 1 is responsible for packaging or containing electrochemical batteries or cells 2, connecting the electrochemical cells 2 to each other and/or to other components of the vehicle electrical system, and regulating the electrochemical cells 2 and other features of the battery assembly 1. For example, the battery assembly 1 may include features that are responsible for monitoring and controlling the electrical performance of the battery assembly 1, managing the thermal behavior of the battery assembly 1, containment and/or routing of effluent (e.g., gases that may be vented from a cell 2), and other aspects of the battery assembly 1.

According to an exemplary embodiment, the battery assembly 1 includes a plurality of electrochemical cells 2 (e.g., lithium-ion cells, nickel-metal-hydride cells, lithium polymer cells, etc., or other types of electrochemical cells now known or hereafter developed). According to an exemplary embodiment, the electrochemical cells 2 are generally cylindrical lithium-ion cells configured to store an electrical charge. According to other exemplary embodiments, the electrochemical cells 2 could have other terminal configurations or physical configurations (e.g., oval, prismatic, polygonal, etc.). The capacity, size, design, and other features of the electrochemical cells 2 may also differ from those shown according to other exemplary embodiments.

Each of the electrochemical cells 2 are electrically coupled to one or more other electrochemical cells 2 or other components of the battery assembly 1 using connectors provided in the form of bus bars 5 or similar elements. According to an exemplary embodiment, the bus bars 5 are housed or contained in bus bar holders (not shown). According to an exemplary embodiment, the bus bars 5 are constructed from a conductive material such as copper (or copper alloy), aluminum (or aluminum alloy), or other suitable material. According to an exemplary embodiment, the bus bars 5 may be coupled to terminals 4a, 4b of the electrochemical cells 2 by welding (e.g., resistance welding) or through the use of fasteners (e.g., a bolt or screw may be received in a hole at an end of the bus bar 5 and screwed into a threaded hole in the terminal).

Although illustrated in FIG. 2 as having a particular number of electrochemical cells 2 (i.e., three rows of electrochemical cells arranged such that three electrochemical cells are arranged in each row, for a total of nine electrochemical cells), it should be noted that according to other exemplary embodiments, a different number and/or arrangement of electrochemical cells 2 may be used in the battery assembly 1 depending on any of a variety of considerations (e.g., the desired power for the battery assembly 1, the available space within which the battery assembly 1 must fit, etc.).

According to an exemplary embodiment, the plurality of electrochemical cells 2 are provided in a first member, structure, housing, or tray (not shown). According to an exemplary embodiment, the tray receives the individual electrochemical cells 2 in the proper orientation for assembling the battery assembly 1. According to an exemplary embodiment, the tray may also include features to provide spacing of the electrochemical cells 2 away from the bottom of the tray and/or from adjacent cells. For example, according to an exemplary embodiment, the trays may include a series of features (e.g., openings, apertures, sockets, etc.) to locate and hold the electrochemical cells 2 in position above a bottom of the tray. According to an exemplary embodiment, the tray may be made of a polymeric material or other suitable material (e.g., electrically insulated material). A cover (not shown) and/or a base plate (not shown) may be provided to partially or completely surround or enclose the cells 2 and the trays.

Still referring to FIG. 3, according to an exemplary embodiment, the electrochemical cells 2 are generally cylindrical lithium-ion cells 2 configured to store an electrical charge. The cells 2 include a cylindrical housing 3 having a positive terminal 4a and a negative terminal 4b on one end and a vent (not shown) on an opposite end. According to other exemplary embodiments, the cells 2 could have other terminal configurations or physical configurations (e.g., oval, prismatic, polygonal, etc.). The capacity, size, design, terminal configuration, and other features of the cells 2 may also differ from those shown according to other exemplary embodiments.

One advantageous feature of the embodiments described herein is that an improved storage battery assembly may be provided which may be assembled in a manner that provides cheap interconnection of a circuit board and cell terminals and easy and reliable interconnection of cell terminals to each other by use of conductive bars.

This advantage is achieved with a storage battery assembly for vehicles comprising a plurality of battery cells, each battery cell comprising a closed cell housing and at least one cell terminal extending from the cell housing, electrical conductive bars mounted on dedicated cell terminals, the conductive bars electrically connecting battery cells and at least one circuit board comprising an electric circuitry provided for monitoring and/or controlling of battery cells, wherein cell terminals are carrying electrically conductive interconnection washers mounted thereon, wherein the interconnection washers extending to a dedicated circuit board and being connected with electronic circuitry on the respective circuit board, and wherein the circuit board is connected to at least one interconnection washer being located adjacent to the at least one cell terminal to which the at least one interconnection washer is connected.

According to an exemplary embodiment, electric conductive bars are mounted on dedicated cell terminals independent from the at least one circuit board. The at least one circuit board is connected to dedicated cell terminals by use of interconnection washers. The interconnection washer has the advantage, that the connection of a cell terminal and a circuit board can be made close to the cell terminal. Further, the washer can be mounted onto the cell terminal together with the bus bar.

The at least one interconnection washer is preferably elastic (e.g., flexible), so that the washer and the connection between the circuit board and the battery terminal by use of the washer withstands high vibrational load.

Further it is preferred that at least one of the circuit boards is located between the respective battery cell housing and conductive bars. In this preferred embodiment, the intermediate space between the battery cell housing and the conductive bars are used to place the circuit boards. The advantage of this design is that the circuit board can be fastened in the gap between the cell housing and the conductive bars by the conductive bars themselves. The contact between the battery cell terminals and the circuit boards is established by use of the interconnection washers, which are also securely fastened by the conductive bars mounted to the battery terminals.

In order to avoid short circuits especially when using electric conductive cell housings, an insulation layer should be provided between the circuit board and the adjacent cell housing and/or an adjacent conductive bar. The insulation layer can be made as integral part of the printed circuit board. In a preferred embodiment, at least one of the circuit boards comprises holes corresponding to the location of the cell terminals. The circuit boards are located on battery cells with the cell terminals extending through respective holes of the circuit board. Thus, when mounting a storage battery assembly, first the circuit boards are provided over the cell terminals with the interconnection washers extending from the printed circuit board to the respective battery cell terminals. Second, the conductive bars are fastened to respective battery cell terminals, whereby electrically connecting adjacent battery cells and dedicated washers and establishing an electrical conductive connection of battery cell terminals and interconnection washers.

Advantageously, at least one of the circuit boards is placed on top of at least one of the cell housings with the cell terminals extending through the at least one circuit board. The interconnection washers are mounted to the extending cell terminals having flexible or elastic legs of a height being greater than the gap between the upper surface of a circuit board to which the interconnection washer is connected and the connection between the interconnection washer and the respective cell terminal. The flexible or elastic legs are spring biased to the circuit board when connecting the respective interconnection washer to the dedicated cell terminal.

By use of the flexible or elastic legs of the interconnection washers having a height being greater than the gap between the upper surface of the circuit board in the connection, a spring biased contact of the washer to the printed circuit board is achieved, which can withstand high vibrational load. Further, it is of advantage when at least one of the circuit boards is flexible.

The at least one interconnection washer can be welded or soldered to a conductive path on a dedicated circuit board. Soldering or welding the interconnecting washer to the dedicated conductive path on the circuit board has the advantage over a press contact to be more reliable. Further, the interconnection washer can be welded or soldered to the printed circuit board before mounting the printed circuit board onto the battery cell assembly. Thus, the printed circuit board can be assembled in one step to the terminals of the battery cells. In a next step, the conductive bars are installed on the battery cell terminals, thereby fastening the washers to the cell terminals.

In another preferred embodiment, the interconnection washers are placed on top of a free end of a dedicated cell terminal. The conductive bars are placed on top of a respective interconnection washer. The cell terminals comprise internal threads and the interconnection washers and conductive bars comprise respective openings. A cell terminal, an interconnection washer, and a conductive bar are mounted together by a fastener (e.g., a screw) extending through the openings of the conductive bar and the interconnection washer and screwed into the internal thread of the cell terminal. The use of the internal thread in the cell terminal has the advantage that the cell terminal, interconnection washer, and conductive bar can be mounted together in one step providing a highly reliable electrical and mechanical connection, which can also withstand high vibrational loads.

In another preferred embodiment, the at least one interconnection washer is formed by a metal cap comprising a base plate, a side wall circumferentially surrounding the base plate, and a foot plate extending from the side wall to the outside at the lower edge of the opposite side of the base plate forming a rest or stop for a circuit board. The base plate is located at an upper edge of the side wall. Spring legs extend from the side wall in the direction to the rest and away from the cap. The spring legs provided on the cap have a length adapted to spring bias a circuit board resting on the rest. Thus, the printed circuit board can be provided onto the interconnection washer and can be held by the foot plate forming a rest for the circuit board and by the spring legs forming a stud.

In another preferred embodiment, at least one of the interconnection washers is formed by an upper metal ring and a lower metal ring and a metal plate extending from the lower metal ring to the upper metal ring. The metal plate is integrally formed with the upper metal ring and the lower metal ring providing a spring element between the lower metal ring and the upper metal ring. The lower metal ring is mounted on a cell terminal and the upper metal ring is mounted on a circuit board. Preferably, the lower metal ring has a diameter smaller than a diameter of the upper metal ring. Then, the metal plate is helically wound with a diameter increasing from the connection point with a lower metal ring to the connection point with the upper metal ring. Preferably, the metal plate extends from the inner edge of the upper metal ring to the outer edge of the lower metal ring.

The interconnection washer can be picked and placed and soldered onto a printed circuit board as any other electronic component. Due to the metal plate extending from the lower metal ring to the upper metal ring, the interconnection washer has an elastic compliance (i.e., it is flexible) in the z-axis parallel to the axis of the cell terminal that can accommodate high vibrational loads and unplanarity of the cell terminals and which does not stress the solder joint. The design ensures long term electrical connection between the printed circuit board and the cell electrode terminals.

In a preferred embodiment, a temperature sensor is installed on the metal connection path between the cell terminal and the electronic circuitry. Preferably, the temperature sensor is mounted on the interconnection washer. The temperature sensor is electrically connected to the electronic circuitry provided for monitoring the state of the at least one battery cell connected to the respective metal connection path.

Because of the good thermal conductivity of the copper parts or contacts in between the temperature sensor and the cell terminal, the temperature which is measured is highly reproducible and less sensitive to disturbances or perturbation induced by, e.g., a battery cooling system, than previous temperature sensing methods.

The temperature sensor can be very small and surface mountable and thus can be picked and placed and soldered on the printed circuit board as other electronic components. Assembly cost is reduced to a minimum. Further, there is no need for wires or a connector between the temperature sensor and the measuring circuitry. Material cost is also reduced to a minimum.

The temperature sensors are able to approximate the temperature of electrodes of the cells due to a well defined correlation between the internal temperature of the cell electrodes and the metal parts comprising the cell electrodes and terminals.

Current measurement for a series of the battery cells is preferably performed by use of a shunt. In a preferred storage battery assembly, at least one of the conductive bars provided for connecting cell terminals with each other or with a power line has an integrated shunt.

FIG. 3 shows a storage battery assembly 1 comprising a plurality of battery cells 2 placed side-by-side of each other. The battery cells 2 each comprise a cylindrical-shaped housing 3 incorporating wound electrodes and electrolyte as it is known per se.

Cell terminals 4a, 4b are protruding out of the respective cell housing 3. A first battery terminal is provided for the positive pole and a second cell terminal 4b is provided for the negative pole of the battery cell 2.

The battery cells 2 are connected in series by use of conductive bars 5. The conductive bars 5 each connect a positive cell terminal 4a of a first battery cell 2 and a negative battery terminal 4b of an adjacent battery cell 2.

In order to monitor the state of each of the battery cells 2, a control unit 6 is provided for each of the battery cells 2 and located close by the battery terminals 4a, 4b of a respective battery cell. The control unit 6 comprises a printed circuit board and electronic circuitry provided to monitor and/or control the state and the load-unload cycle of the dedicated battery cell 2. The electronic circuitry can optionally include sensors, like temperature sensors, voltage sensors and/or current sensors, or can be connected to such sensors located separately from the printed circuit board.

The connection of the control unit 6 and the cell terminals 4a, 4b of a respective battery cell 2 is established by means of interconnection washers 7 extending from the battery terminals 4a, 4b to the adjacently-located printed circuit board of the control unit 6. The interconnection washers 7 are mounted on the respective cell terminal 4a, 4b together with the dedicated conductive bar 5.

Figure 4:
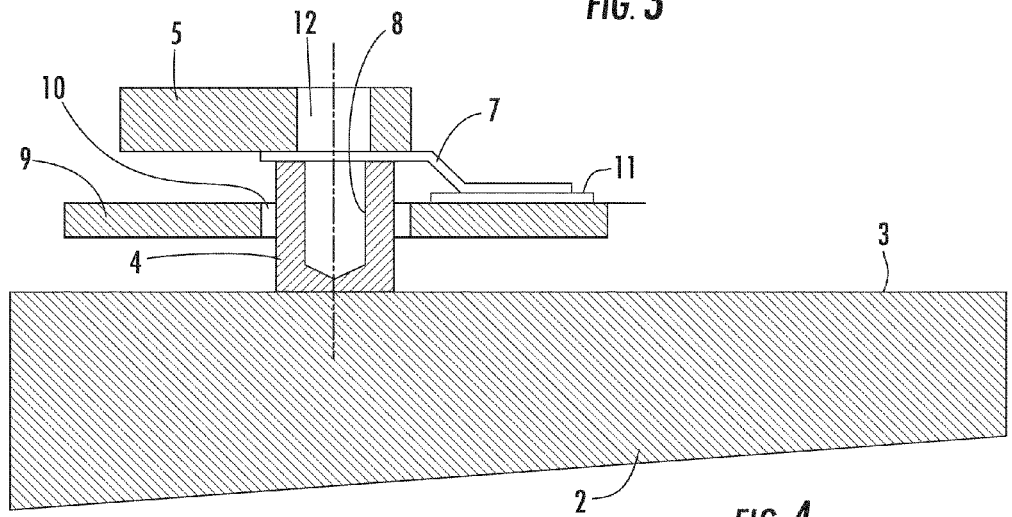
FIG. 4 is a cross-sectional view of a battery assembly comprising a first embodiment of an interconnection washer.

FIG. 4 shows a cross-section view of a battery cell assembly. The battery cell 2 and the cell terminal 4 extending over the battery housing 3 is clearly visible in the side view. The cell terminal 4 comprises an internal thread 8 being aligned parallel to the longitudinal direction of the cell terminal 4, preferably in the center of the cell terminal 4.

A printed circuit board 9 carrying electronic circuitry for establishing the control unit 6 is installed on top of the cell housing 3. The printed circuit board 9 comprises an opening in alignment with the cell terminal positions so that at least one cell terminal 4 extends through the opening 10 of the printed circuit board 9. The printed circuit board 9 carries conductive lines 11 (e.g., made from copper or copper alloy), which are connected to electronic circuitry (not shown). An interconnection washer 7 is coupled (e.g., soldered or welded) to a dedicated conductive line 11 on the printed circuit board 9. The embodiment of the interconnection washer 7 shown in FIG. 4 is formed like a tongue and placed on top of the free end of the cell terminal 4. The interconnection washer 7 is angled downward from the top of the respective battery cell 2 in direction to the conductive line 11 of the printed circuit board 9 so as to weld or solder the free end of the interconnection washer 7 to the conductive line 11.

The conductive bar 5 is placed on top of the interconnection washer 7 and the cell terminal 4. Both the conductive bar 5 and the interconnection washer 7 comprise openings 12 in alignment with each other and the internal thread 8 of the cell terminal 4 so as to allow a fastening screw extending through the openings 12 into the internal thread 8 and to fasten the conductive bar 5, interconnection washer 7, and cell terminal 4 together.

Figure 5:
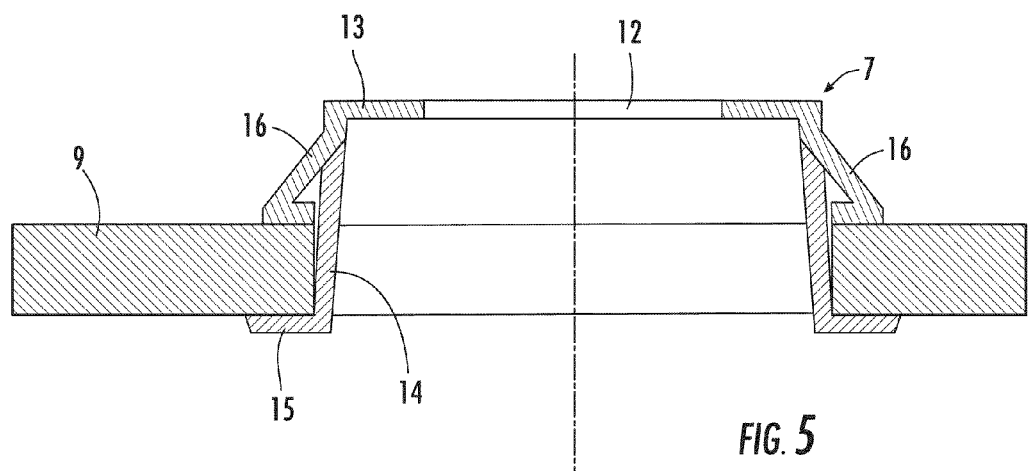
FIG. 5 is a cross-sectional view of a second embodiment of an interconnection washer clipped onto a printed circuit board.

FIG. 5 shows a second embodiment of an interconnection washer 7. The interconnection washer 7 has the form of a cap comprising a metal base plate 13. The base plate 13 has the form of a ring comprising the opening 12 for inserting a fastening screw (not shown). A side wall 14 is integrally formed with the base plate 13. The side wall 14 circumferentially surrounds the base plate 13. The base plate 13 is located at the upper edge of the side wall 14. Integrally formed with the lower edge of the side wall 14 is a foot plate 15 having a ring form similar to the base plate 13, but with an increased diameter. The foot plate 15 extends from the side wall 14 to the outside in contrast to the base plate 13 extending from the side wall 14 to the inside of the cap-formed interconnection washer 7. The foot plate 15 forms a rest or stop for a circuit board 9 which is clipped onto the interconnection washer 7 from the side of the base plate 13 into the direction of the foot plate 15.

Spring legs 16 are extending from the side wall 14 in the direction of the printed circuit board 9 and the rest or stop provided by the foot plate 15 and extending away from the cap-formed interconnection washer 7. The length of the spring legs 16, which are folded in the direction of the side wall 14 at their free ends, are adapted to the thickness of the printed circuit board 9 intended to be installed onto the interconnection washer 7 so as to spring bias the circuit board 9 onto the interconnection washer 7.

The printed circuit board 9 in combination with this embodiment of the interconnection washer 7 is preferably rigid, whereas the printed circuit board 9 of the first embodiment shown in FIG. 4 can be rigid or preferably flexible. The interconnection washer 7 shown in any of the embodiments may be rigid, semi-rigid, flexible, or semi-flexible.

Figure 6:
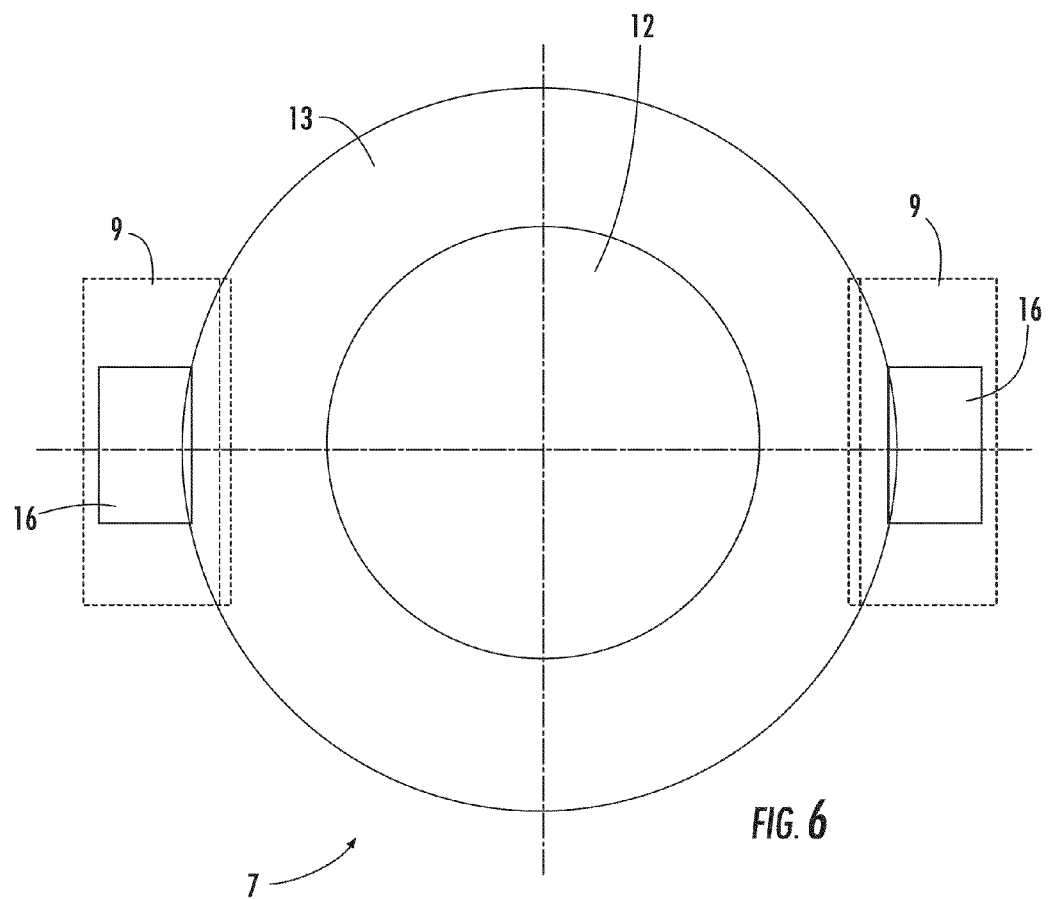
FIG. 6 is a top view of the interconnection washer of FIG. 5.

FIG. 6 shows a top view of the interconnection washer 7 of FIG. 5. It should be noted that the interconnection washer 7 is mounted on top of the cell terminal 4 so that the inner surface of the base plate 13 rests on the free end of the battery cell terminal 4.

Figure 7:
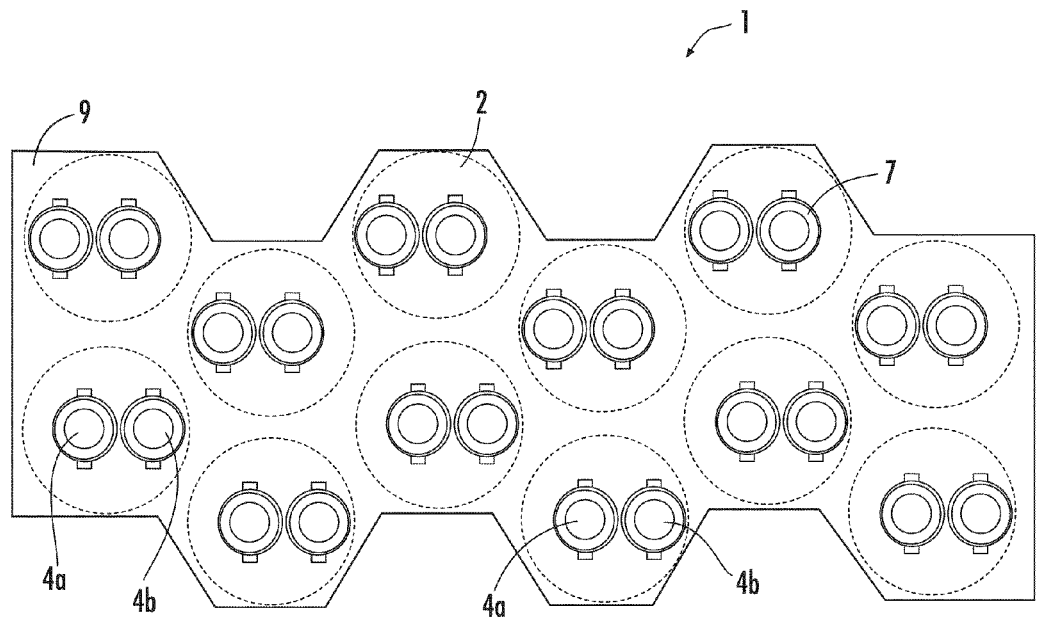
FIG. 7 is a top view of a battery assembly comprising a printed circuit board mounted onto a plurality of battery cells according to an exemplary embodiment.

FIG. 7 shows a top view of a storage battery assembly comprising a serrated printed circuit board 9 installed on top of a plurality of battery cells 2. The form of the printed circuit board 9 is adapted to the staggered arrangement of the battery cells 2. The interconnection washers 7 clipped onto the printed circle board 9 are protruding over the upper surface of the printed circuit board 9 and located on top of the free end of the battery cell terminals 4a, 4b.

Figure 8:
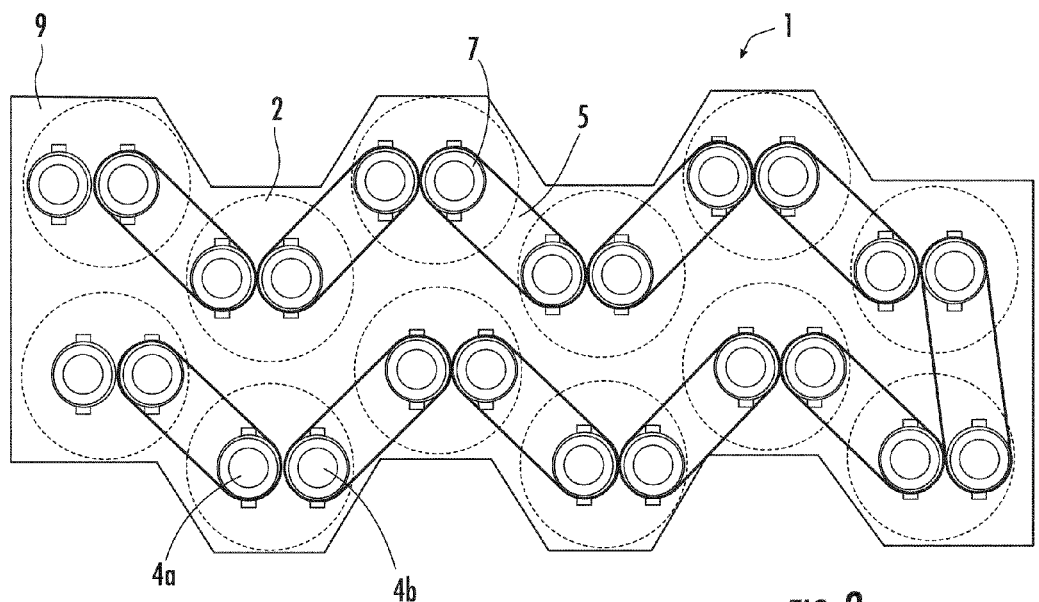
FIG. 8 is a top view of the battery assembly of FIG. 7 including conductive bars according to an exemplary embodiment.

FIG. 8 shows the storage battery assembly 1 of FIG. 7 with the conductive bars 5 mounted on top of the interconnection washers 7 and the dedicated cell terminals 4a, 4b. The battery cells 2 grouped side-by-side to each other in a staggered layout are electrically connected in series to each other by use of the conductive bars 5. The staggered arrangement of the battery cells 2 enhances the package density.

Figure 9:
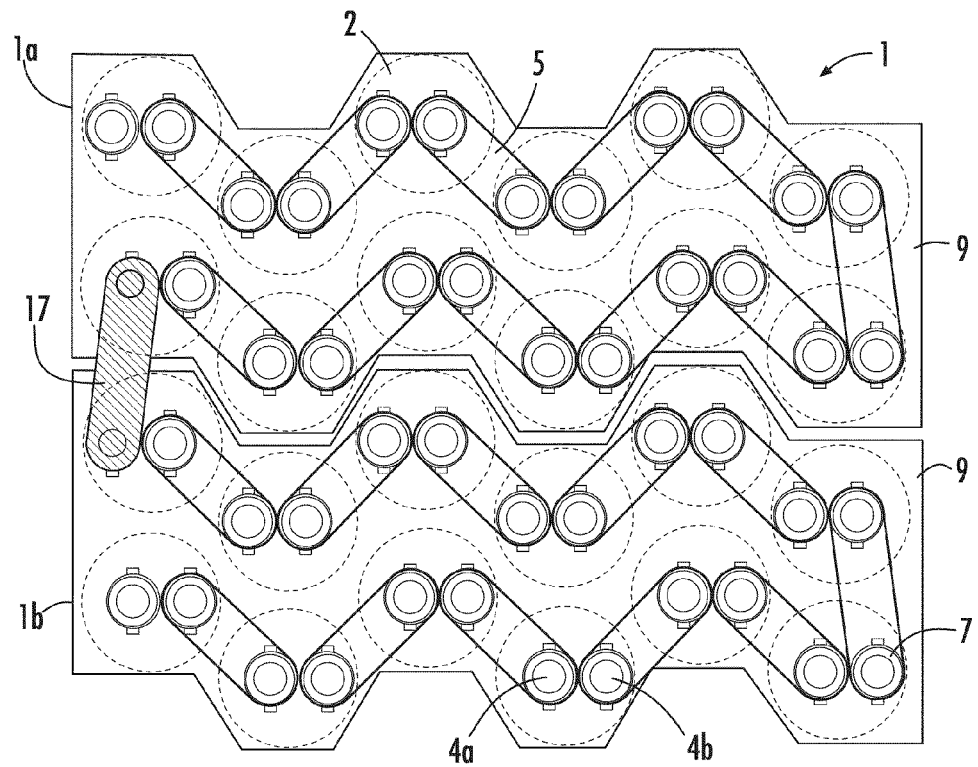
FIG. 9 is a top view of a battery assembly comprising two sections of battery assemblies according to FIG. 8 connected to each other according to an exemplary embodiment.

FIG. 9 shows a storage battery assembly 1 comprising two sections of battery assemblies 1a, 1b, as shown in FIG. 8. The serrated design of the printed circuit board 9 has the advantage that two sections of battery assemblies 1a, 1b including the serrated printed circuit boards 9 can be arranged into one another (e.g., nested with one another). The sections of storage battery cell arrangements 1a, 1b are electrically connected to each other by use of an interconnection conductive bar 17 similar to the conductive bars 5 of each section 1a, 1b.

Figure 10:
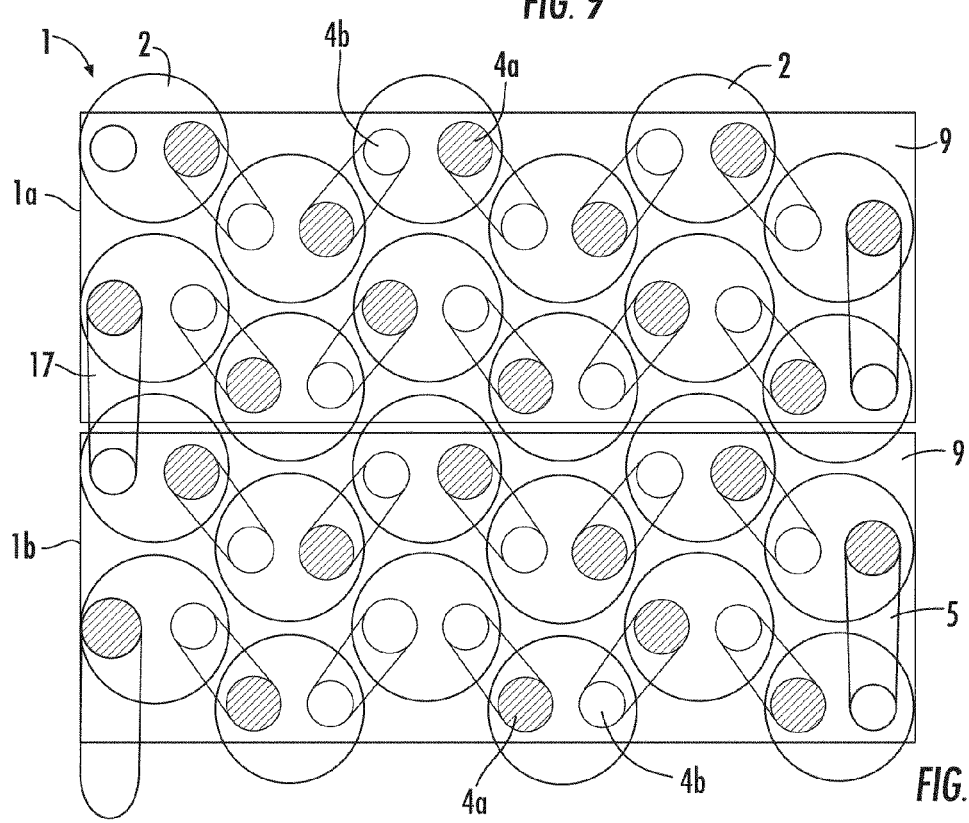
FIG. 10 is a top view of a battery assembly comprising two sections of battery assemblies and a rectangular printed circuit board according to an exemplary embodiment.

FIG. 10 shows a top view of a similar design according to FIG. 9. The only difference is the design of the printed circuit boards 9, which are rectangular. The battery cells 2 are connected to each other with the conductive bars 5 (e.g., in a generally zigzag pattern).

Figure 11:
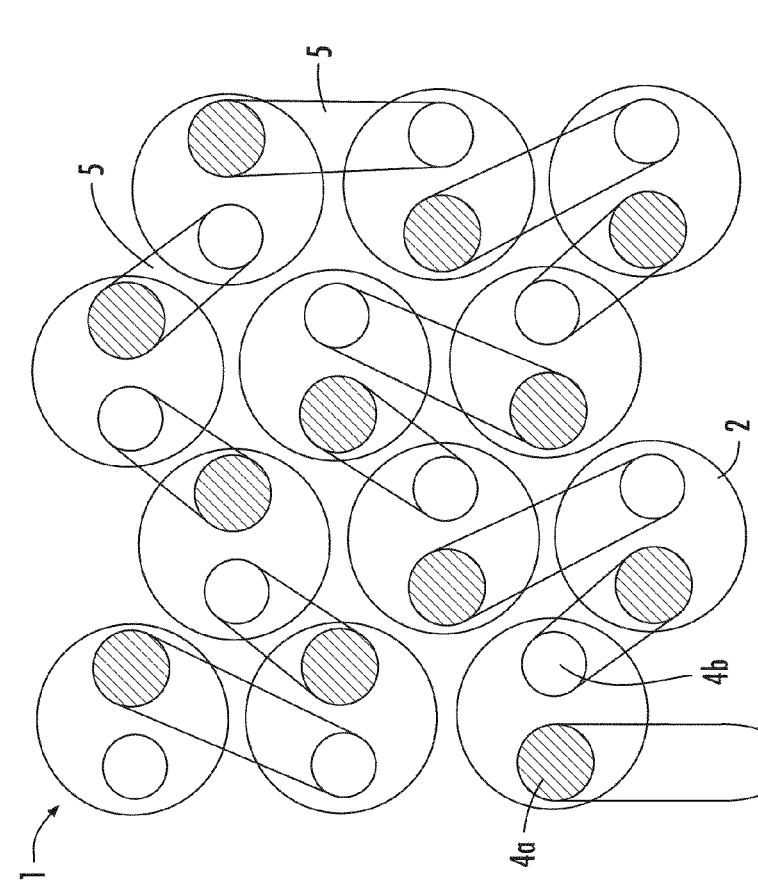
FIG. 11 is a top view of another battery assembly according to an exemplary embodiment.

FIG. 11 shows a top view of another embodiment of a storage battery assembly 1. The staggered battery cells 2 are connected to each other with conductive bars 5 of two different lengths.

Figure 12:
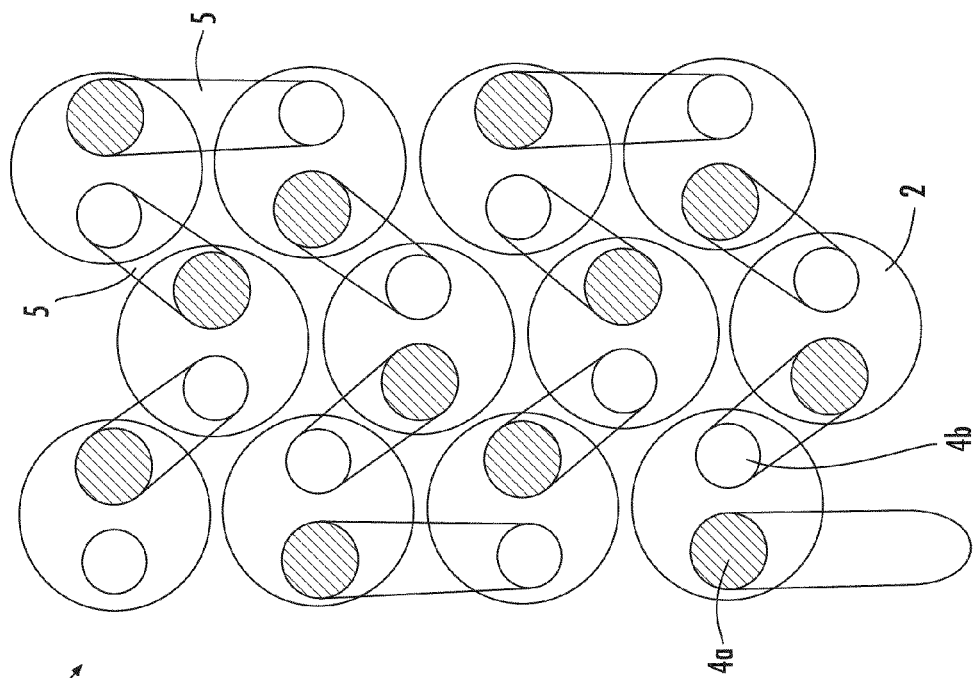
FIG. 12 is a top view of still another arrangement of a battery assembly according to an exemplary embodiment.

FIG. 12 shows another embodiment of the storage battery assembly 1 comprising conductive bars 5 of two different lengths, wherein the longer conductive bars 5 are provided for connecting the outer cell terminals in a first longitudinal direction. The shorter conductive bars 5 are provided for connecting battery terminals 4a, 4b of the adjacent battery cells 2 extending diagonal to the longer conductive bars 5.

Figure 13:
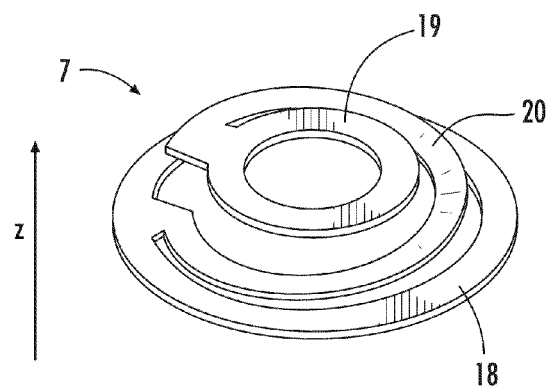
FIG. 13 is a perspective view of a third embodiment of an interconnection washer.

FIG. 13 shows a third embodiment of an interconnection washer 7 comprising an upper metal ring 18 and a lower metal ring 19 each having an opening and being in line to each other. The upper and lower metal ring 18, 19 are placed at a distance from each other, the distance being bridged by a metal plate 20 extending from the upper metal ring 18 to the lower metal ring 19. It should be noted that the interconnection washer 7 is turned upside-down in FIG. 13 compared to its installation position in order to be able to show the details of the washer.

As can be seen from FIG. 13, the metal plate 20 extends from the inner edge of the upper metal ring 18 to the outer end edge of the lower metal ring 19 and is helically curved with the diameter increasing from the connection point with the lower metal ring 19 to the connection point with the upper metal ring 18. The lower metal ring 19 has a smaller diameter than the upper metal ring 18.

Figure 14:
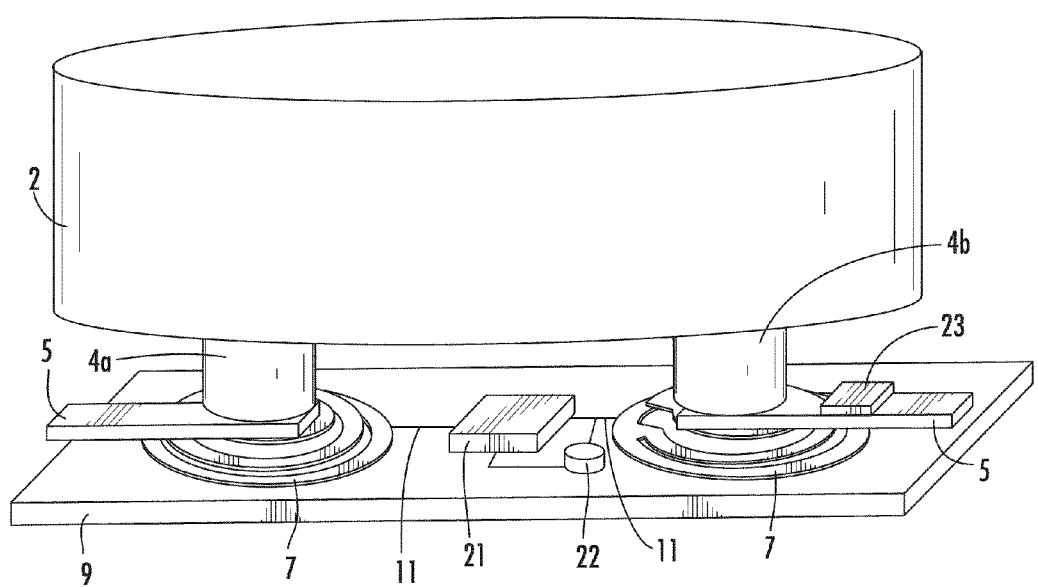
FIG. 14 is a perspective view of a battery cell connected to a printed circuit board with the interconnection washer according to FIG. 13 according to an exemplary embodiment.

The interconnection washer 7 of FIG. 13 can be picked and placed and soldered onto a printed circuit board 9 as it is shown in the perspective view of FIG. 14. Thus, the interconnection washer 7 can be handled as any other electronic component 21 mounted onto the printed circuit board 9. It should be noted that the arrangement shown in FIG. 14 is presented upside down to its typical position.

The interconnection washer 7 is flexible (i.e., has an elastic compliance) in the z-axis that can withstand high vibrational loads and accommodate the unplanarity of the cell terminals 4a, 4b as to not stress the solder joint of the interconnection washer 7 and the lines 11 of the printed circuit board 9. Therefore, the interconnection washer 7 may provide long term electrical connection between the printed circuit board 9 and the cell terminal 4a, 4b.

As can be seen in FIG. 14, the conductive bars 5 each provided for electrical connecting adjacent battery cells 2 are located between the free end of a cell terminal 4a, 4b and the upper surface of the smaller lower metal ring 19.

According to an exemplary embodiment, temperature sensors 22 are installed directly on the printed circuit board 9 that performs the temperature measurement. One terminal of the temperature sensor 22 is electrically (and thus thermally) connected to a copper track of the printed circuit board 9 which is electrically (and thus thermally) connected to a cell electrode terminal 4a, 4b, by means of a connecting device such as an interconnection washer 7 (e.g., in form of a spring contact). The voltage at the cell terminal 4b which the temperature sensor 22 is connected to, is the ground reference voltage for the electronic circuitry 21 that performs the temperature measurement. The other terminal of the temperature sensor 22 is connected to the input of the electronic circuitry 21 that performs the temperature measurement.

The advantages of this solution are because of the good thermal conductivity of the copper parts or contacts in between the temperature sensor 22 and the cell terminal 4b, the temperature which is measured is much more representative of the cell internal temperature than with previous temperature sensing solutions. Moreover, the measurement is much more reproducible and less sensitive to disturbance induced by, for example, a battery cooling system, than previous temperature sensing methods.

The temperature sensors 22 can be very small and surface mountable (e.g., a surface mountable device) and thus can be picked and placed and soldered on the printed circuit board 9 as other electronic components. Assembly costs are reduced to a minimum. There is no need for wires nor connectors between the temperature sensor 22 and the measuring circuitry 21. Material costs are also reduced to a minimum.

The installation of the temperature sensor 22 makes use of the fact that there is a well defined correlation between the internal temperature of the battery cell 2 and the metal parts composing the cell electrode and terminals 4a, 4b. Measuring the temperature of such cell terminals 4a, 4b is much more accurate than measuring the ambient air between adjacent cells.

For measuring the current that flows in or out the battery assembly, a shunt 23 is provided on at least one conductive bar 5. A shunt 23 offers a good accuracy over a wide range of current measurement. According to an exemplary embodiment, the shunt 23 is integrated into one of the copper bars 5 connecting two consecutive cells 2 of the battery assembly 1.

The resulting conductive bar 5 is a composite device composed of three parts, a first copper part, connected to one cell electrode terminal 4b of a given polarity, a second resistive alloy part, i.e., the shunt 23, across which will be measured the voltage drop proportional to the current flowing through it, and a third copper part, connected to the electrode terminal 4a of opposite polarity of the consecutive battery cell 2 in the battery assembly 1.

A preferred embodiment consists of connecting the shunt bar between the battery assembly negative pole and the first battery cell 2 of the battery assembly 1, or between the first and the second battery cells 2 of the battery assembly 1.

There are many cost advantages for this solution. First, there is no need for additional power wiring between the shunt 23 and the battery terminals 4a, 4b, nor additional fasteners (e.g., bolts and nuts) to connect the cables to the shunt 23. Second, there is no additional component needed. Instead, the shunt 23 is included in one of the conductive connection bars 5 between two consecutive battery cells 2. Further, the connections between each side of the resistive alloy of the shunt 23 and the printed circuit board 9 on which is assembled the electronic circuitry 21 (which is able to measure the voltage drop across the shunt 23) are optimized in terms of length. In addition, the space and weight required to perform the current measurement are reduced, which is a significant advantage considering the space and weight requirements of a battery system.

Referring now to FIGS. 15-24, a battery module 120 is shown according to an exemplary embodiment. According to an exemplary embodiment, the battery module 120 includes electrochemical batteries or cells 130, and includes features or components for connecting the electrochemical cells 130 to each other and/or to other components of the vehicle electrical system, and also for regulating the electrochemical cells 130 and other features of the battery module 120. For example, the battery module 120 may include features that are responsible for monitoring and controlling the electrical performance of the battery module 120, managing the thermal behavior of the battery module 120, containment and/or routing of effluent (e.g., gases that may be vented from a cell 130), and other aspects of the battery module 120.

According to an exemplary embodiment, the battery module 120 includes a plurality of electrochemical cells 130 (e.g., lithium-ion cells, nickel-metal-hydride cells, lithium polymer cells, etc., or other types of electrochemical cells now known or hereafter developed). According to an exemplary embodiment, the electrochemical cells 130 are generally cylindrical lithium-ion cells configured to store an electrical charge. According to other exemplary embodiments, the electrochemical cells 130 could have other physical configurations (e.g., oval, prismatic, polygonal, etc.). The capacity, size, design, and other features of the electrochemical cells 130 may also differ from those shown according to other exemplary embodiments.

Figure 17:
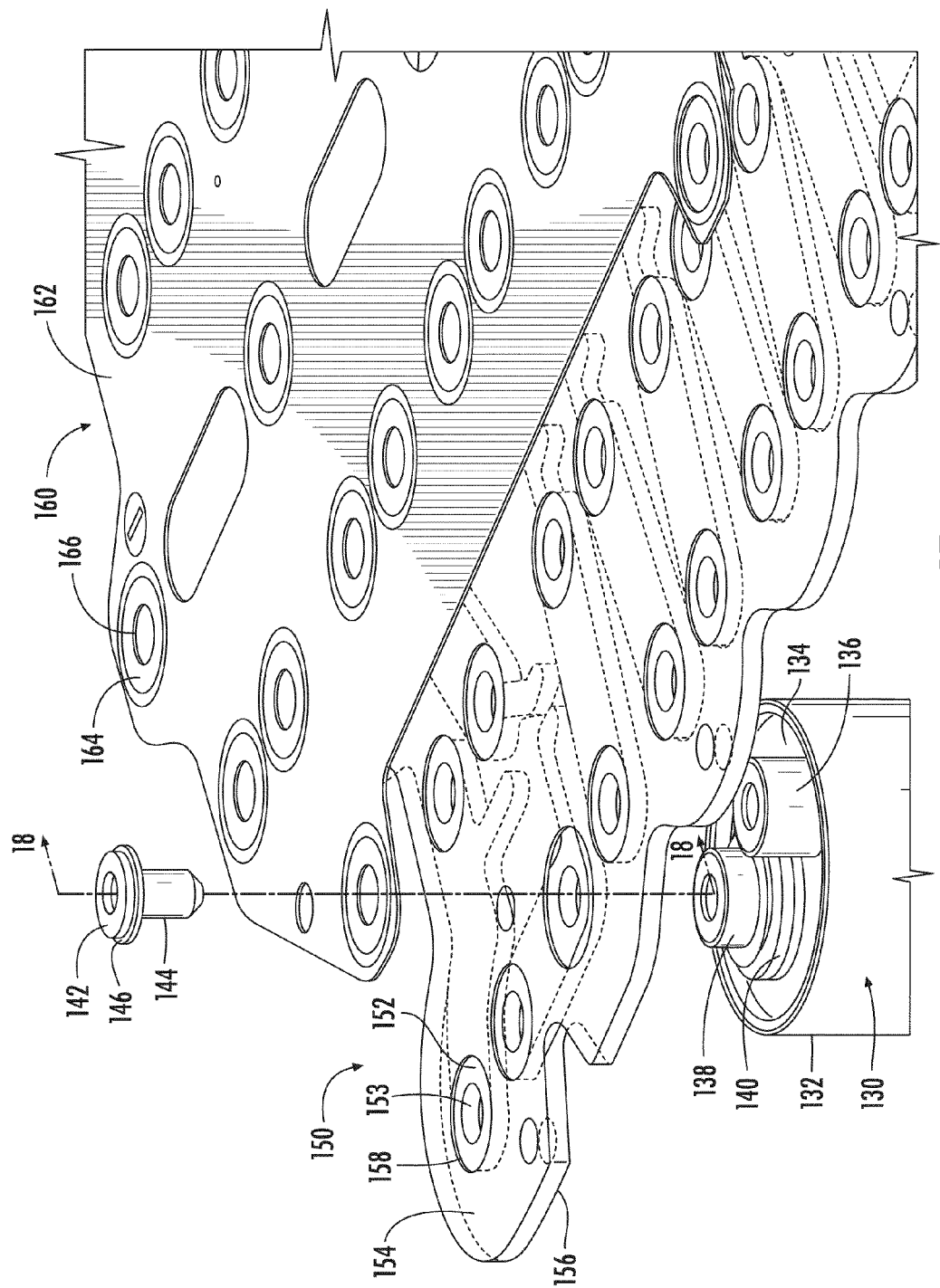
FIG. 17 is a partial exploded view of the battery module of FIG. 15.
Figure 18:
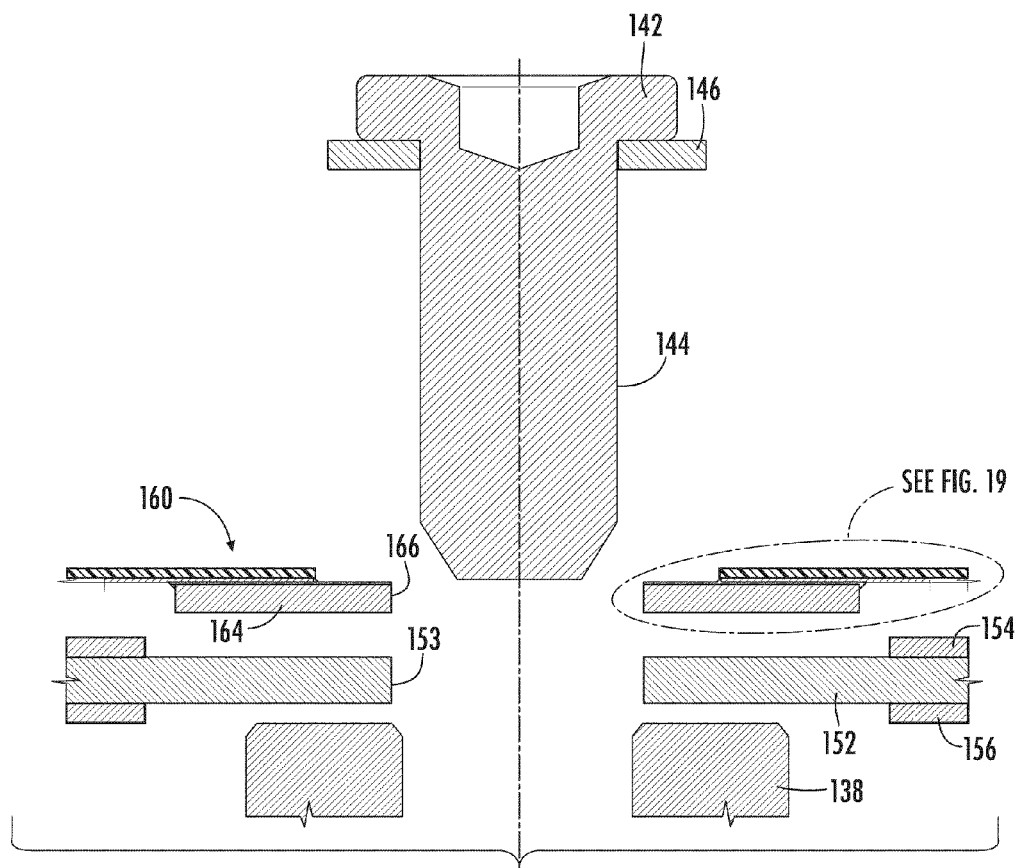
FIG. 18 is a partial cross-sectional view of the battery module of FIG. 17 taken along lines 18-18 of FIG. 17.

Each of the electrochemical cells 130 are electrically coupled to one or more other electrochemical cells 130 or other components of the battery module 120 using connectors provided in the form of bus bars 152 or similar elements (see, e.g., FIG. 17). According to an exemplary embodiment, the bus bars 152 are housed or contained in a bus bar holder 150. According to an exemplary embodiment, the bus bars 152 are constructed from a conductive material such as copper (or copper alloy), aluminum (or aluminum alloy), or other suitable material. According to an exemplary embodiment, the bus bars 152 may be coupled to terminals 136, 138 of the electrochemical cells 130 by welding (e.g., resistance welding) or through the use of fasteners (e.g., a bolt or screw 142 may be received in a hole 153 at an end of the bus bar 152 and screwed into a threaded hole in the terminal 136, 138).

Figure 15:
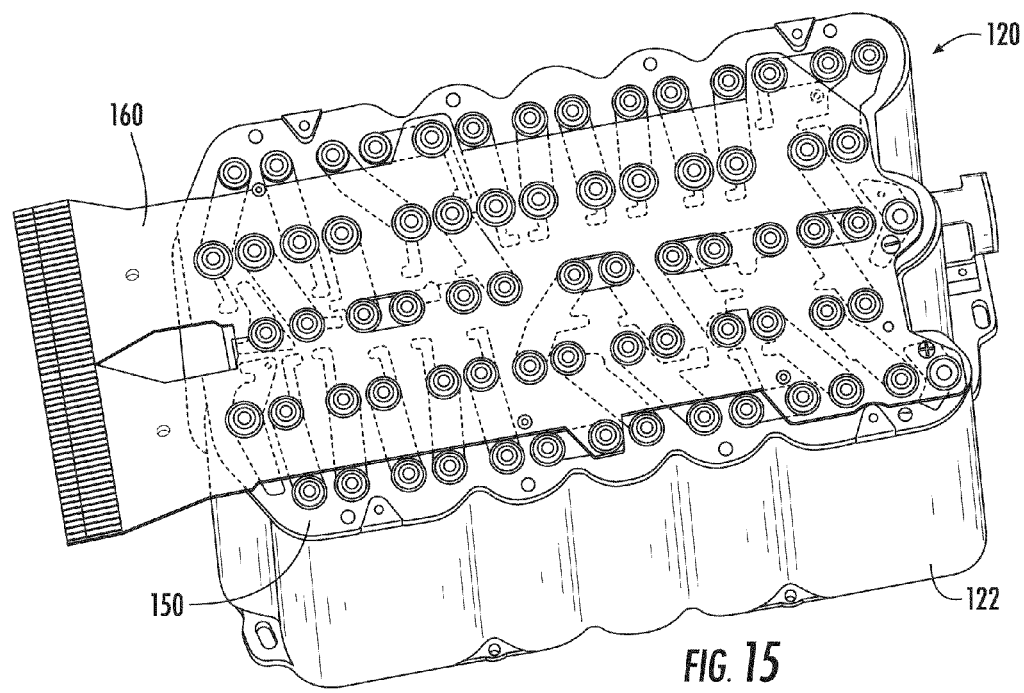
FIG. 15 is a perspective view of a battery module having a washer assembly according to another exemplary embodiment.

Although illustrated in FIG. 15 as having a particular number of electrochemical cells 130 (i.e., five rows of electrochemical cells arranged such that seven electrochemical cells are arranged in each row, for a total of 35 electrochemical cells), it should be noted that according to other exemplary embodiments, a different number and/or arrangement of electrochemical cells 130 may be used in the battery module 120 depending on any of a variety of considerations (e.g., the desired power for the battery module 120, the available space within which the battery module 120 must fit, etc.).

According to an exemplary embodiment, the plurality of electrochemical cells 130 are provided in a first member, structure, housing, or tray (not shown). According to an exemplary embodiment, the tray receives the individual electrochemical cells 130 in the proper orientation for assembling the battery module 120. According to an exemplary embodiment, the tray may also include features to provide spacing of the electrochemical cells 130 away from the bottom of the tray and/or from adjacent cells. For example, according to an exemplary embodiment, the trays may include a series of features (e.g., openings, apertures, sockets, etc.) to locate and hold the electrochemical cells 130 in position above a bottom of the tray. According to an exemplary embodiment, the tray may be made of a polymeric material or other suitable material (e.g., electrically insulated material). A cover 122 and/or a base plate (not shown) may be provided to partially or completely surround or enclose the cells 130 and the trays.

Referring to FIG. 17, according to an exemplary embodiment, the electrochemical cells 130 are generally cylindrical lithium-ion cells 130 configured to store an electrical charge. The cells 130 include a cylindrical housing 132 having a positive terminal 136 and a negative terminal 138 on one end and a vent (not shown) on an opposite end. According to other exemplary embodiments, cells 130 could have other terminal configurations or physical configurations (e.g., oval, prismatic, polygonal, etc.). The capacity, size, design, terminal configuration, and other features of the cells 130 may also differ from those shown according to other exemplary embodiments.

Referring to FIG. 15, the battery module 120 includes a bus bar assembly 150 and a washer assembly 160. According to an exemplary embodiment, the bus bar assembly 150 comprises a plurality of bus bars 152 provided between an upper member 154 and a lower member 156 (e.g., as shown in FIG. 17). According to another exemplary embodiment, only one member (e.g., either the upper member 154 or lower member 156) may be provided with the plurality of bus bars 152. According to an exemplary embodiment, the bus bars 152 are coupled to at least one of the upper or lower members 154, 156 (e.g., by an adhesive). According to an exemplary embodiment, the upper member 154 and/or lower member 156 may be made from a flexible material (such as Mylar®), a rigid material, or any other suitable material.

As shown in FIG. 17, each of the plurality of bus bars 152 includes an aperture 153 at either end of the bus bar 152. According to an exemplary embodiment, each aperture 153 is configured to receive a fastener 142. The upper and lower members 154, 156 include an aperture 158 that is configured to allow the exposed portion of the bus bar 152 to be conductively coupled to a terminal 136, 138 of a cell 130.

Figure 16:
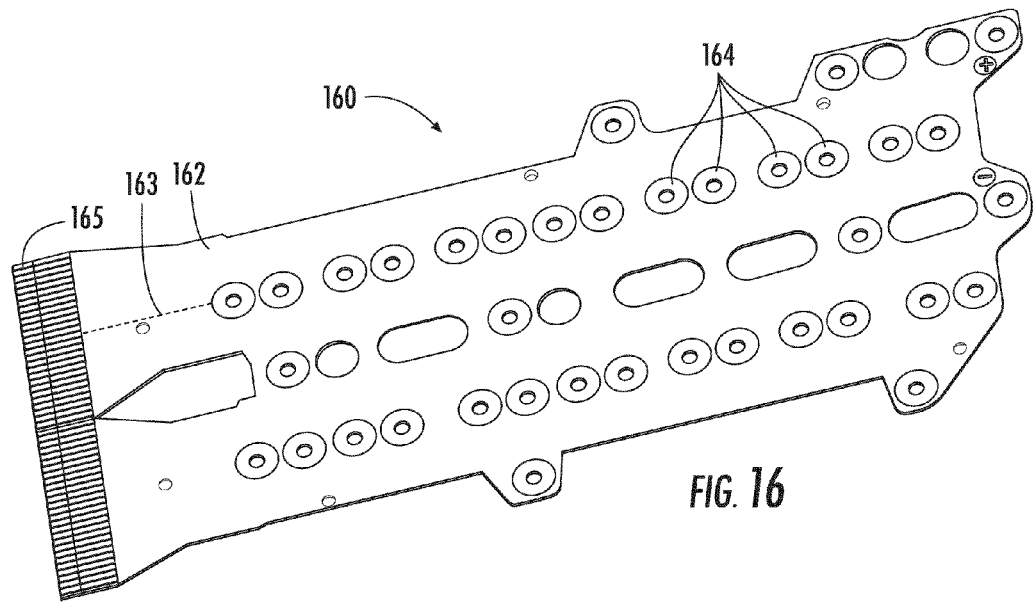
FIG. 16 is a bottom perspective view of the washer assembly of FIG. 15.

Referring to FIG. 16, the washer assembly includes a member shown as a printed circuit board 162 and a plurality of conductive members or washers 164 coupled to the printed circuit board 162. According to an exemplary embodiment, the washers 164 are interconnection washers formed from a conductive material such as a metal (e.g., copper, copper alloy, aluminum, aluminum alloy, etc.). Each washer 164 is coupled (e.g., soldered, welded, etc.) to a dedicated conductive line or wire 163 on the printed circuit board 162. Note that only a single conductive line is shown; although it should be noted that according to an exemplary embodiment, there is a separate conductive line for each washer.

According to an exemplary embodiment, a plurality of connectors 165 are electrically connected to the conductive lines 163 and are configured to electrically connect the washers 164 to a control system (e.g., a battery management system). According to another exemplary embodiment, the connectors 165 are crimped onto the printed circuit board 162. According to an exemplary embodiment, the printed circuit board 162 is a flexible printed circuit board constructed of a flexible material such as Mylar® or another suitable material. According to an exemplary embodiment, the conductive line 163 (e.g., a lead line) connects each of the washers 164 to the connectors 165 to aid in measuring the voltage of the electrochemical cell 130.

As shown in FIGS. 17-22, according to an exemplary embodiment, each washer 164 includes an aperture 166 that is configured to be aligned above an aperture 153 of an underlying bus bar 152 to receive a fastener 142 for coupling the washer 164 to a terminal 136, 138 of an associated cell 130. According to an exemplary embodiment, the fastener 142 includes threads 144 that are configured for threaded engagement with internal threads (not shown) of the terminals 136, 138. According to another exemplary embodiment, a washer 146 may be used with fastener 142 to aid in compressing the washer 164 (and the bus bar 152) to the top of the terminals 136, 138. According to an exemplary embodiment, the washer 146 has an external diameter that is smaller than the exposed portion of the washer 164 such that a substantial portion of the washer 146 is in contact with the washer 164 (see, e.g., FIGS. 18 and 21).

Figure 19:
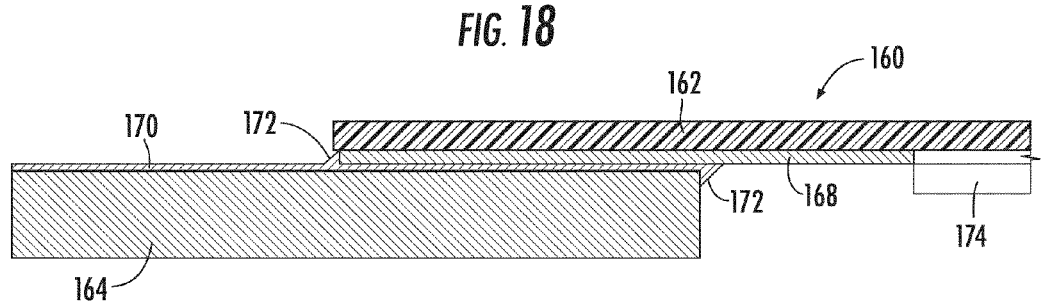
FIG. 19 is a detail view of a portion of the washer assembly of FIG. 18 according to an exemplary embodiment.
Figure 20:
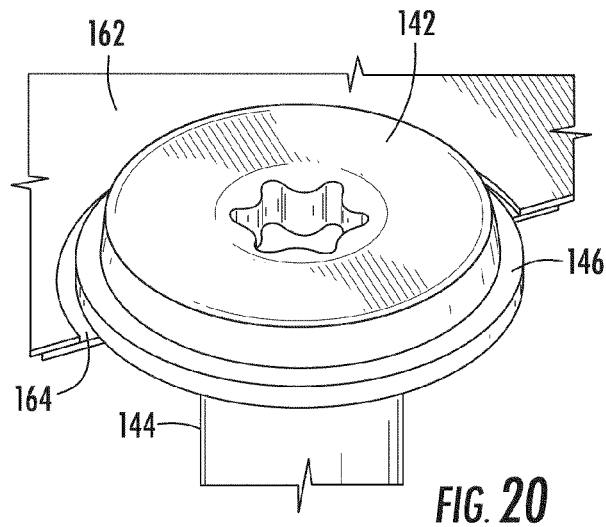
FIG. 20 is a partial perspective cut-away view of the washer assembly of FIG. 15.
Figure 21:
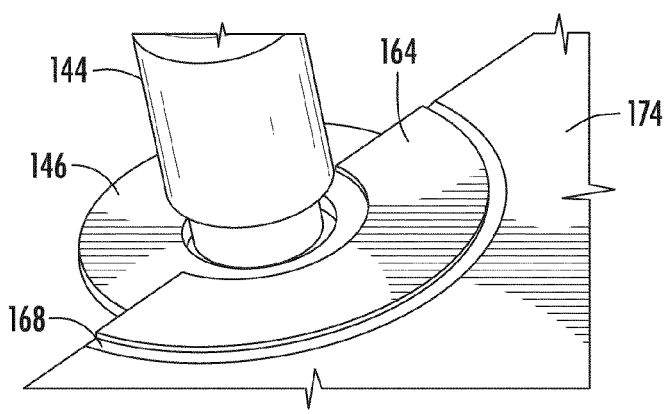
FIG. 21 is a bottom partial perspective cut-away view of the washer assembly of FIG. 20.
Figure 22:
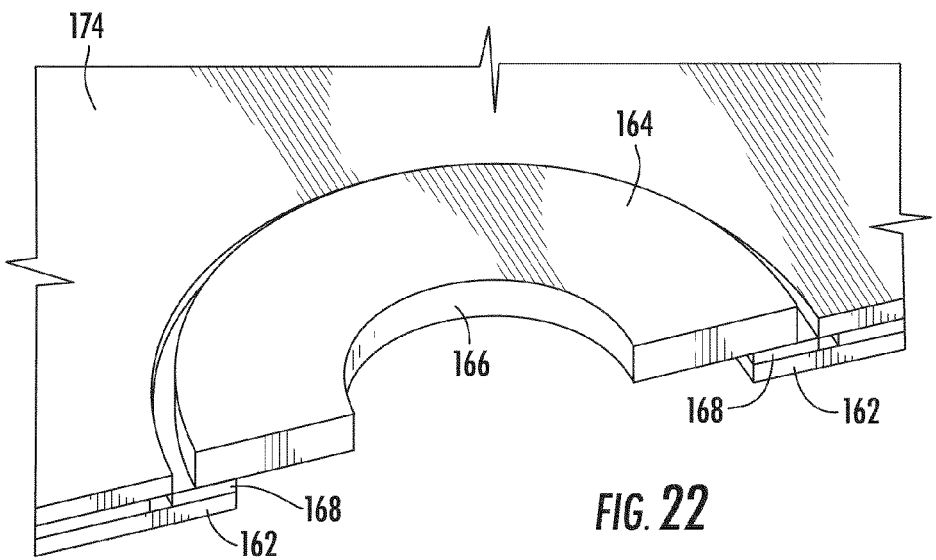
FIG. 22 is a partial perspective cut-away view of the washer assembly of FIG. 21.

As shown in FIG. 19, according to an exemplary embodiment, the washer 164 may have a plating 170. According to an exemplary embodiment, the plating is a tin plating and is used to couple the washer 164 to the printed circuit board 162. According to an exemplary embodiment, a soldering area 168 may be provided on the printed circuit board 162. According to an exemplary embodiment, the soldering area 168 is a copper or copper alloy pad. According to an exemplary embodiment, the washer assembly 160 may include a cover or member shown as coverlay 174 configured to substantially cover (and insulate) the conductive lines on the printed circuit board 162 that connect the washers 164 to the connectors 165.

Figure 23:
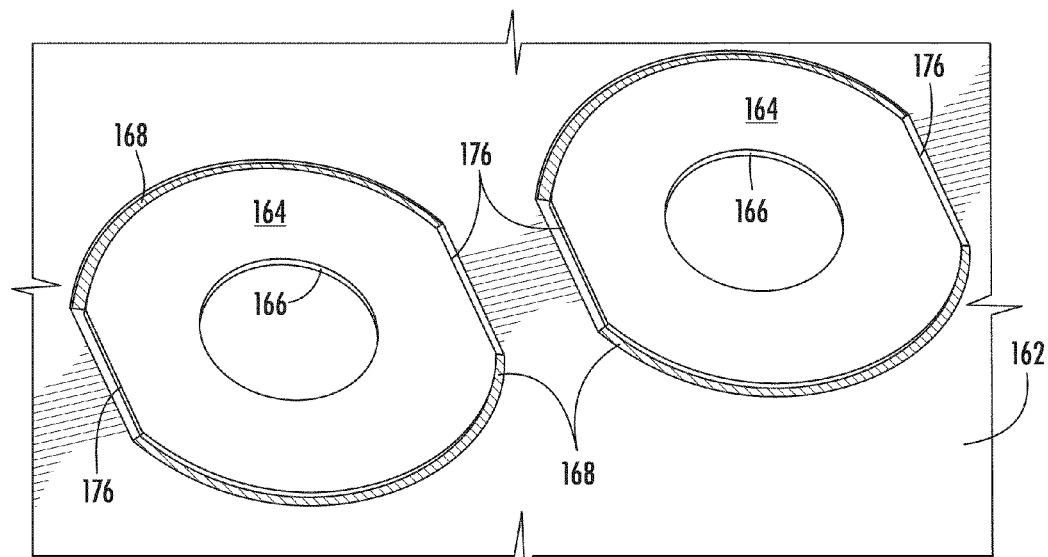
FIG. 23 is a partial perspective view of the washer assembly of FIG. 16 according to an exemplary embodiment.
Figure 24:
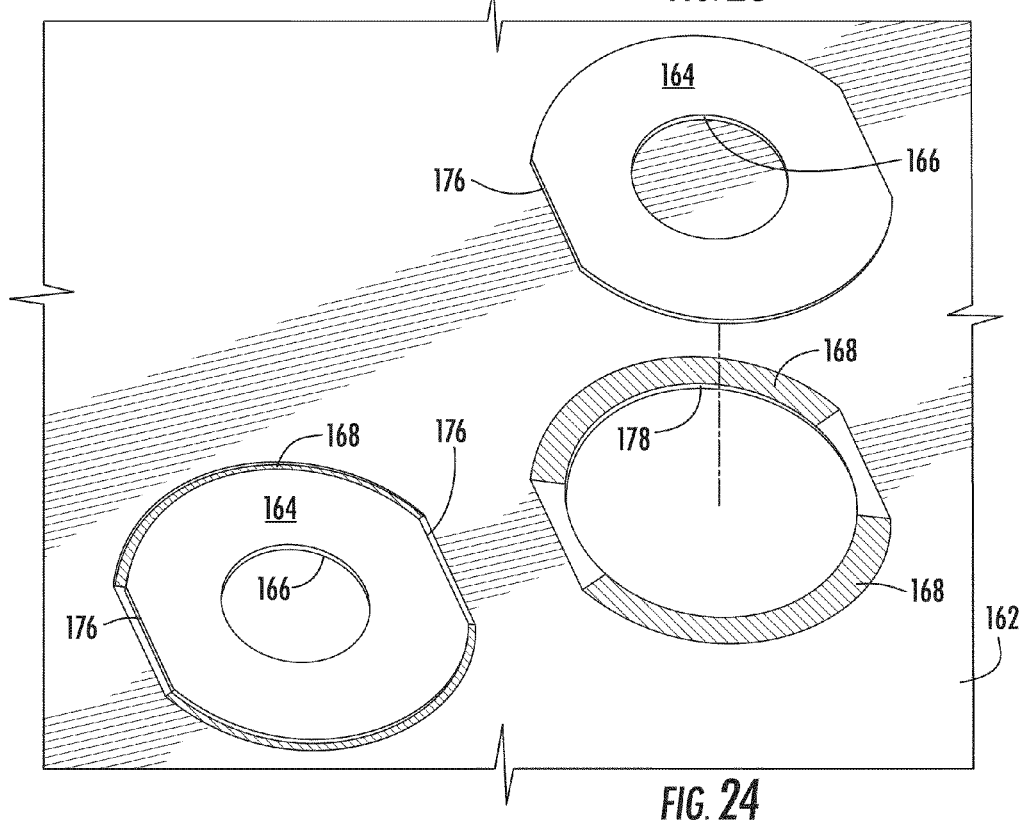
FIG. 24 is a partial exploded view of the washer assembly of FIG. 23 according to an exemplary embodiment.

Referring now to FIGS. 23-24, a washer 164 is shown according to another exemplary embodiment. As shown in FIGS. 23-24, the washer 164 includes a generally circular inner circumference which defines an aperture 166 and a generally circular outer circumference. According to one exemplary embodiment, the outer circumference of the washer 164 includes a flat edge or portion 176. According to an exemplary embodiment, the washer 164 includes two flat portions 176 opposed from one another on opposite sides of the washer 164. According to an exemplary embodiment, the flat portion 176 is provided to ensure that a clearance space is provided between adjacent washers 164.

According to an exemplary embodiment, the washer 164 is welded or soldered all along the outer circumference of the washer 164 to the printed circuit board 162. According to another exemplary embodiment, as shown in FIGS. 23-24, the washer 164 is soldered only along the circular portions of the outer circumference at the soldering areas 168. According to other exemplary embodiments, the washers may be soldered to the printed circuit board 162 at any suitable locations.

According to one exemplary embodiment, the washer 164 has an external diameter of about 15 mm, but may vary more or less according to other exemplary embodiments. According to another exemplary embodiment, washer 164 has an internal diameter of about 6.5 mm, but may vary more or less according to other exemplary embodiments. According to another exemplary embodiment, the washer 164 has a thickness of about 0.2 mm, but may vary more or less according to other exemplary embodiments. According to one exemplary embodiment, the washer 164 is a flexible washer or a semi-flexible washer. According to another exemplary embodiment, the washer 164 may be a rigid or semi-rigid washer. According to an exemplary embodiment, the washer 164 is a generally flat, thin washer.

According to an exemplary embodiment, the printed circuit board 162 includes a plurality of apertures 178. The apertures 178 are configured to be aligned with the terminals 136, 138 of the cells 130 of the battery module 120. According to an exemplary embodiment, a plurality of washers 164 are coupled to the circuit board 162 such that an inner diameter 166 of the washers 164 is generally aligned with a central axis of the apertures 178 of the circuit board 162. The washers 164 are also generally aligned with the apertures 153 of the bus bars 152 and with the terminals 136, 138. According to an exemplary embodiment, the washer assembly 160 is configured to be substantially simultaneously coupled to the terminals 136, 138 of the electrochemical cells 130 in order to conductively couple the washers 164 (and the bus bars 152) to the terminals 136, 138.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the exemplary embodiment as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the interconnection washer assembly as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present exemplary embodiment.

What is claimed is:

1. A battery module comprising:
   a plurality of electrochemical cells, each of the electrochemical cells comprising at least one terminal projecting from an end thereof;
   a plurality of bus bars provided on a first member, each one of the plurality of bus bars including an aperture at each end thereof; and
   a second member comprising a plurality of conductive members, each of the conductive members including an aperture aligned with one of the apertures of one of the plurality of bus bars and with one of the terminals of one of the plurality of electrochemical cells, wherein each of the conductive members is conductively coupled to a terminal of an electrochemical cell to aid in measuring the voltage of the electrochemical cell.

2. The battery module of claim 1, wherein each conductive member is a generally flat washer.

3. The battery module of claim 2, wherein each washer comprises at least one flat edge along an outer circumference of the washer configured to provide clearance between adjacent washers.

4. The battery module of claim 2, wherein each washer is soldered to a copper pad provided on the second member.

5. The battery module of claim 4, wherein the second member is a circuit board.

6. The battery module of claim 5, wherein the circuit board is a flexible printed circuit board.

7. A battery module comprising:
   a plurality of electrochemical cells, each of the electrochemical cells comprising at least one terminal extending from an end thereof;
   a bus bar assembly comprising a plurality of bus bars, each one of the plurality of bus bars including an aperture at each end thereof; and
   a washer assembly comprising a plurality of generally flat washers secured to a circuit board, each of the washers including an aperture aligned with one of the apertures of one of the plurality of bus bars and with one of the terminals of one of the plurality of electrochemical cells, wherein each of the washers is conductively coupled to a terminal of an electrochemical cell;
   wherein each washer comprises at least one flat edge along an outer circumference of the washer configured to provide clearance between adjacent washers.

8. The battery module of claim 7, wherein each washer is soldered to a copper pad provided on the circuit board.

9. The battery module of claim 7, wherein the circuit board is a flexible printed circuit board.

10. A battery module comprising:
    a plurality of electrochemical cells, each of the electrochemical cells comprising at least one terminal extending from an end thereof;
    a bus bar assembly comprising a plurality of bus bars, each one of the plurality of bus bars including an aperture at each end thereof; and
    a washer assembly comprising a plurality of generally flat washers secured to a circuit board, each of the washers including an aperture aligned with one of the apertures of one of the plurality of bus bars and with one of the terminals of one of the plurality of electrochemical cells, wherein each of the washers is conductively coupled to a terminal of an electrochemical cell;
    wherein each washer is soldered to a copper pad provided on the circuit board.

11. The battery module of claim 10, wherein the circuit board is a flexible printed circuit board.

* * * * *